United States Patent [19]

MacManus

[11] Patent Number: 4,745,813
[45] Date of Patent: May 24, 1988

[54] EXTENDED SPINDLE ELECTRIC GAGE MECHANISM

[75] Inventor: Daniel C. MacManus, Flint, Mich.

[73] Assignee: General Motors Corporation, Detroit, Mich.

[21] Appl. No.: 26,044

[22] Filed: Mar. 16, 1987

[51] Int. Cl.⁴ ............................................. G01D 11/02
[52] U.S. Cl. ............................. 73/866.1; 324/154 PB
[58] Field of Search ................. 73/866.1; 324/154 PB

[56] References Cited

U.S. PATENT DOCUMENTS

| 2,513,184 | 6/1950 | Lamb | 73/866.1 X |
| 3,168,689 | 2/1965 | Gelenius | 340/319 X |
| 3,465,596 | 9/1969 | De Mair | 73/866.1 |

FOREIGN PATENT DOCUMENTS 664647 9/1938 Fed. Rep. of Germany ..... 73/866.1

Primary Examiner—Tom Noland
Attorney, Agent, or Firm—Warren D. Hill

[57] ABSTRACT

An electric gage driving a pointer has an extended spindle so that the gage movement can be substantially spaced from the pointer. The gage includes a spindle, an armature driving the spindle, a bobbin supporting a bearing for the spindle and electrical coils around the bobbin. An outrigger support remote from the bobbin and adjacent the pointer holds another spindle bearing which may be misaligned with the bobbin. The bearing on the bobbin accommodates the misaligned spindle.

2 Claims, 1 Drawing Sheet

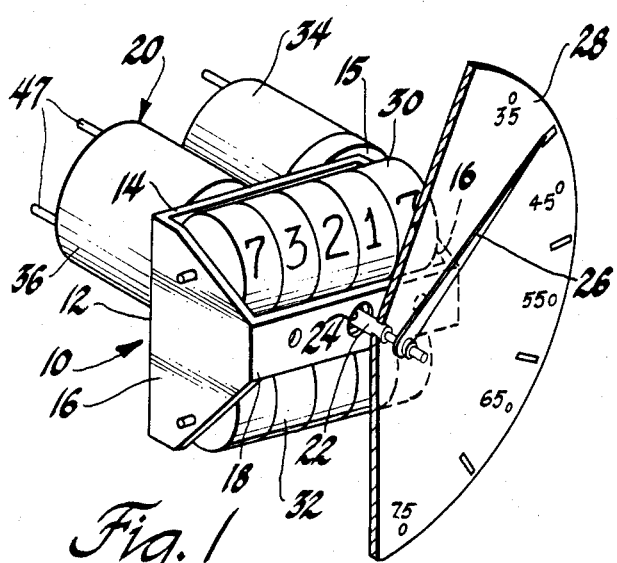
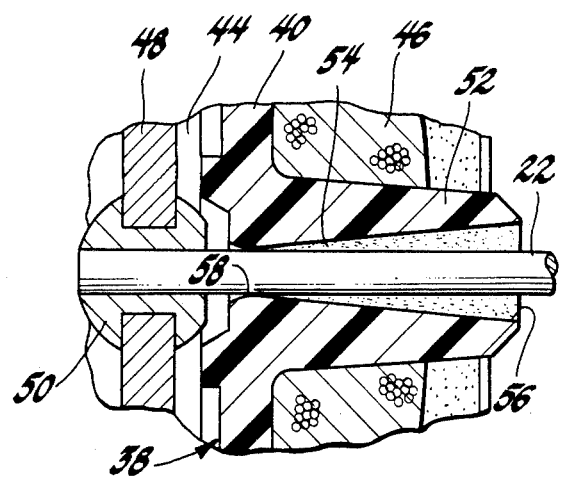
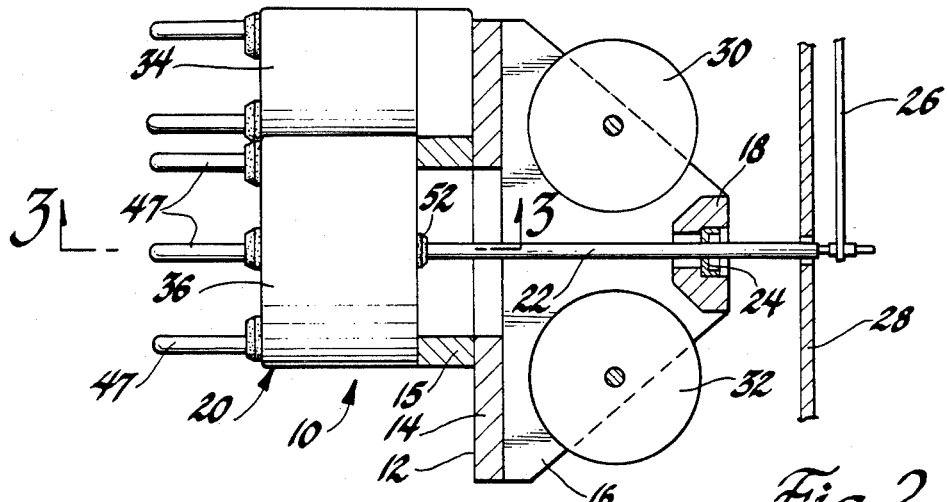
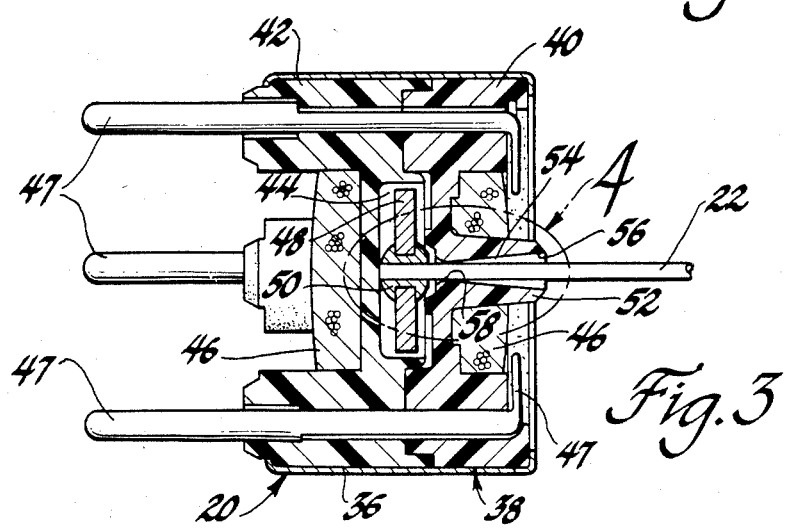
Fig. 1
Fig. 4
Fig. 2
Fig. 3

EXTENDED SPINDLE ELECTRIC GAGE MECHANISM

FIELD OF THE INVENTION

This invention relates to an electric gage and in particular to such a gage having an extended spindle for driving a pointer at a location remote from the gage movement.

BACKGROUND OF THE INVENTION

It is commonplace in automotive vehicle instrumentation to use electric gages driving pointers mounted near the gage movement. Preferably such gages are of the air core type shown in U.S. Pat. No. 3,168,689 and have a plastic bobbin supporting an outer winding, a spindle journaled in two opposite walls of the bobbin, and a permanent magnet armature within the bobbin and secured to the spindle between the journal points. There are some applications where there is not enough room to locate the bobbin assembly adjacent the pointer and it is then required to use a very long spindle to span the distance between the pointer and the bobbin. Such an alteration to the conventional gage structure is unworkable because the mass of the pointer is the greatest mass in the system and the bearings will not withstand the loads imposed on them. A stronger structure of the same general design can be made but only at a significant cost penalty.

SUMMARY OF THE INVENTION

It is therefore an object of the invention to provide a gage structure accommodating an extended spindle and having a reliable operation and low cost.

The invention is carried out by an electric gage mechanism comprising an electric movement having a armature, a spindle, a pointer mounted on one end of the spindle and controlled by the spindle, the armature mounted on the other end of the spindle, and a pair of journals between the armature and the pointer for supporting the spindle, one journal being adjacent the armature and the other journal being remote from the armature.

The invention is further carried out by an electric gage mechanism comprising; a gage movement having a bobbin and an armature within the bobbin, a pointer located remotely from the armature, an extended spindle for driving the pointer and having sufficient length to extend from the armature to the pointer, first and second bearings between the pointer and the armature, an outrigger adjacent the pointer, the first bearing in the outrigger for rotatably supporting the spindle, the first bearing being subject to misalignment with the bobbin, and the second bearing in the bobbin for supporting the spindle for rotary movement, the second bearing being shaped to accommodate misalignment of the first bearing.

BRIEF DESCRIPTION OF THE DRAWINGS

The above and other advantages of the invention will become more apparent from the following description taken in conjunction with the accompanying drawings wherein like reference numerals refer to like parts and wherein:

FIG. 1 is an isometric view of a speedometer and odometer assembly incorporating a gage according to the invention;

FIG. 2 is a cross-sectional view through the assembly of FIG. 1;

FIG. 3 is a detailed cross-sectional view of the gage according to the invention, and FIG. 4 is an enlarged view of the bearing of the gage of FIG. 3.

DESCRIPTION OF THE PREFERRED EMBODIMENT

The speedometer and odometer assembly 10 of FIGS. 1 and 2 includes a frame 12 which has a rear plate 14, a pair of side members 16, and a front outrigger 18. The rear plate 14 carries a spacer 15 which, in turn, supports a speedometer gage 20 having an elongated or extended spindle 22 that extends through an opening in the rear plate 14 and the outrigger 18 where a jewel bearing 24 journals the front end of the spindle 22. A pointer 26 is secured to the front of the spindle 22 for movement across the face of a dial 28. An odometer 30 and a tripmeter 32 are supported by the side members 16 and are driven by a stepper motor 34 that is secured to the rear plate 14. The odometer 30 and the tripmeter 32 are located respectively just above and below the spindle 22.

The gage 20 is enclosed in a metal case 36 which is mounted to the spacer 15. The internal details of the gage 20 movement are best shown in FIG. 3. A plastic bobbin 38 is molded in separate front and rear portions 40 and 42 which mate to form a cavity 44. Electrical coils 46 are wound on the outside of the bobbin 38. Terminals 47 extend through peripheral portions of the bobbin 38 and are connected to the coils 46 for carrying energizing current to the coils. A permanent magnet armature 48 in the form of a disc resides in the cavity 44 and is operatively attached to the spindle 22 by a die cast Babbitt metal hub 50. The hub 50 is shown as generally spherical with a flat forward face but may have other shapes. A large surface area at its point of contact with the cavity wall is preferred so that thrust forces applied by the spindle will be distributed over a large area. The cavity contains a viscous damping fluid to retard rapid changes in armature position.

The front portion 40 has an outwardly extending hub 52 defining a bobbin axis. The hub 52 has a central aperture 54 accommodating the spindle 22 in a manner which seals the cavity yet allows the spindle to rotate about its axis. The aperture also allows the spindle to assume a small angle with respect to the bobbin axis so that some misalignment upon assembly will be tolerated. As shown in FIG. 4, the aperture is molded in the shape of a venturi which has a forward wall 56 tapering outwardly at about 5° from the bobbin axis to limit the off-axis movement of the spindle 22. The rounded venturi throat serves as the bearing 58 for the spindle and makes a sealing line contact with the spindle even when it is disposed off-axis.

It will thus be seen that the structure of the gage allows support of the front of the spindle 22 by the outrigger 18 through a bearing 24, and support of the rear of the spindle 22 by the bearing 58 in the front portion 40 of the bobbin 38. The front bearing 24 does not have to be accurately aligned with the rear bearing 58 due to the special rear bearing shape, thus facilitating assembly of the gage. The structure further permits the gage movement to be located remotely from the pointer via a long spindle which can pass through a narrow space.

The embodiments of the invention in which an exclusive property or privilege is claimed are defined as follows:

1. An electric gage mechanism comprising;
   a gage movement having a bobbin and an armature within the bobbin, a pointer located remotely from the armature,
   an extended spindle for driving the pointer and having sufficient length to extend from the armature to the pointer,
   first and second bearings between the pointer and the armature,
   an outrigger adjacent the pointer,
   the first bearing being placed in the outrigger for rotatably supporting the spindle, the first bearing being subject to misalignment with the bobbin, and
   the second bearing being placed in the bobbin for supporting the spindle for rotary movement, the second bearing being shaped to accommodate misalignment of the first bearing.

2. An electric gage mechanism comprising;
   a gage movement having a control winding, a bobbin supporting the winding, a permanent magnet armature within the bobbin and a spindle driven by the armature,
   a pointer located remotely from the armature and mounted on the distal end of the spindle, a support for the gage movement,
   an outrigger mounted on the support,
   first and second bearings between the pointer and the armature,
   the first bearing being mounted on the outrigger near the pointer for rotatably supporting the spindle, the first bearing being subject to misalignment with the bobbin, and
   the bobbin defining a cavity containing a damping fluid and having a single aperture comprising the second bearing, the aperture having an approximately venturi-shaped throat for sealingly engaging the spindle and for allowing spindle misalignment.

* * * * *